United States Patent
Kim et al.

(10) Patent No.: US 8,835,910 B2
(45) Date of Patent: Sep. 16, 2014

(54) ORGANIC LIGHT EMITTING DISPLAY APPARATUS

(75) Inventors: Ji-Young Kim, Yongin (KR); Mu-Hyun Kim, Yongin (KR); Jin-Goo Kang, Yongin (KR); Dong-Kyu Lee, Yongin (KR); Jae-Bok Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 468 days.

(21) Appl. No.: 13/171,184

(22) Filed: Jun. 28, 2011

(65) Prior Publication Data
US 2012/0012850 A1 Jan. 19, 2012

(30) Foreign Application Priority Data
Jul. 13, 2010 (KR) .................. 10-2010-0067470

(51) Int. Cl.
*H01L 29/08* (2006.01)
*H01L 27/32* (2006.01)

(52) U.S. Cl.
CPC ............... *H01L 27/3258* (2013.01); *H01L 27/3246* (2013.01)
USPC ............. 257/40; 257/59; 257/72; 257/83; 257/E51.022

(58) Field of Classification Search
CPC ........... H01L 27/3244; H01L 27/3246; H01L 27/3248; H01L 27/3258; H01L 27/3262
USPC ............. 257/40, 59, 72, 83, E51.022
See application file for complete search history.

(56) References Cited

U.S. PATENT DOCUMENTS

| 2003/0127651 | A1 | 7/2003 | Murakami et al. |
| 2005/0110011 | A1* | 5/2005 | Im et al. ............... 257/40 |
| 2005/0230684 | A1* | 10/2005 | Seo et al. ............... 257/72 |
| 2006/0197441 | A1* | 9/2006 | Tsai et al. ............... 313/506 |
| 2010/0102713 | A1 | 4/2010 | Seo et al. |

FOREIGN PATENT DOCUMENTS

| JP | 2003-197367 | | 7/2003 |
| JP | 2008-288033 | A | 11/2008 |
| KR | 10-2005-0050495 | A | 5/2005 |
| KR | 10-2006-0033630 | A | 4/2006 |
| KR | 10-2006-0067049 | A | 6/2006 |
| KR | 10-2007-0009005 | A | 1/2007 |
| KR | 10-2007-0034769 | A | 3/2007 |
| KR | 10-2010-0047457 | | 5/2010 |

OTHER PUBLICATIONS

Registration Determination Certificate dated Sep. 4, 2012 issued in Korean Priority Application No. 10-2010-0067470, 5 pages.
KIPO Office action dated Feb. 24, 2012, for Korean priority Patent application 10-2010-0067470, 3 pages.

* cited by examiner

*Primary Examiner* — Minh-Loan T Tran
(74) *Attorney, Agent, or Firm* — Christie, Parker & Hale, LLP

(57) ABSTRACT

An organic light emitting display apparatus in which image quality can be improved. The organic light emitting display apparatus includes: a substrate; a first electrode disposed on the substrate; a pixel definition layer formed on the first electrode and having an opening portion through which a region of the first electrode is exposed; an intermediate layer connected to the first electrode through the opening portion and including an organic emission layer; a second electrode electrically connected to the intermediate layer; and an inorganic planarization pattern portion disposed between the substrate and the first electrode and formed to at least correspond to the opening portion.

12 Claims, 2 Drawing Sheets

ORGANIC LIGHT EMITTING DISPLAY APPARATUS

CROSS-REFERENCE TO RELATED PATENT APPLICATION

This application claims priority to and the benefit of Korean Patent Application No. 10-2010-0067470, filed on Jul. 13, 2010, in the Korean Intellectual Property Office, the entire content of which is incorporated herein by reference.

BACKGROUND

1. Field

The following description relates to an organic light emitting display apparatus and more particularly, to an organic light emitting display apparatus in which image quality can be improved.

2. Description of the Related Art

Recently, display apparatuses have been replaced with portable thin film type flat display apparatuses. From among flat display apparatuses, an organic light-emitting display apparatus is a self light-emitting display apparatus that has a large viewing angle, good contrast characteristics, fast response speeds, and good brightness characteristics and requires a low driving voltage, and has thus drawn attention as a display apparatus of the next-generation.

An organic light-emitting display apparatus includes a first electrode and a second electrode with an organic emission layer therebetween. If a voltage is applied to each of the first and second electrodes, visible light is generated from the organic emission layer.

In general, a variety of insulation layers are disposed in the lower portion of the first electrode positioned below the organic emission layer. The image quality of the organic light emitting display apparatus is greatly influenced by the shape and material of the insulation layer, thereby limiting an improvement in the image quality of an organic light-emitting display apparatus.

SUMMARY

An aspect of an embodiment of the present invention is directed toward an organic light emitting display apparatus in which image quality can be easily improved.

According to an embodiment of the present invention, there is provided an organic light emitting display apparatus including: a substrate; a first electrode disposed on the substrate; a pixel definition layer formed on the first electrode and having an opening portion through which a region (e.g., a set or predetermined region) of the first electrode is exposed; an intermediate layer connected to the first electrode through the opening portion and including an organic emission layer; a second electrode electrically connected to the intermediate layer; and an inorganic planarization pattern portion disposed between the substrate and the first electrode and formed to at least correspond to the opening portion.

The organic light emitting display apparatus may further include: an organic layer disposed between the inorganic planarization pattern portion and the first electrode and contacting the first electrode.

A region of the organic layer corresponding to the inorganic planarization pattern portion may be planar.

The thickness of the organic layer may be smaller than that of the inorganic planarization pattern portion.

The organic light emitting display apparatus may further include: a thin film transistor (TFT) electrically connected to the first electrode.

A passivation layer may be formed on the TFT, wherein the TFT extends to be disposed between the inorganic planarization pattern portion and the first electrode.

The passivation layer may include an organic substance.

The thickness of the passivation layer may be smaller than that of the inorganic planarization pattern portion.

The passivation layer may be formed to cover the inorganic planarization pattern portion.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

The present invention will now be described more fully with reference to the accompanying drawings in which exemplary embodiments of the invention are shown.

Figure 1:
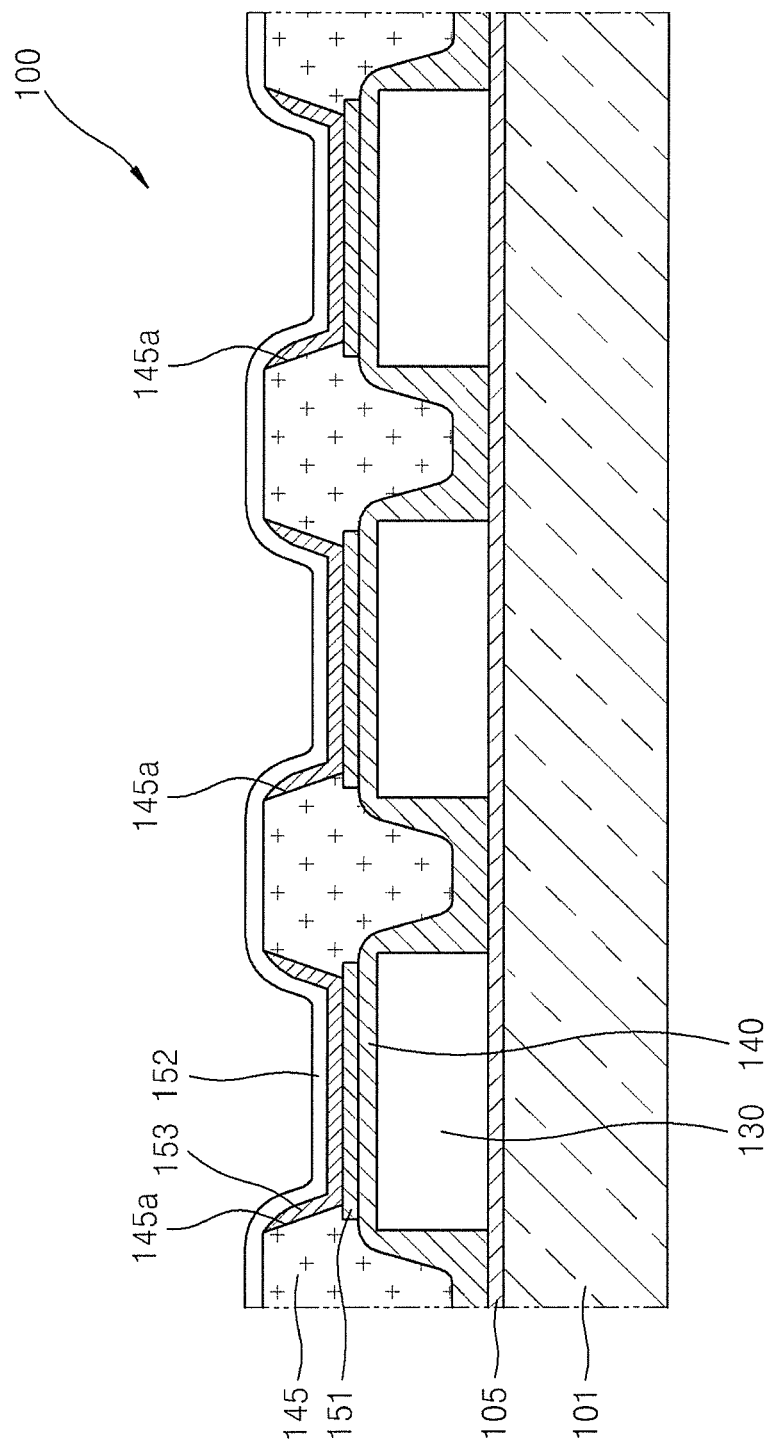
FIG. 1 is a schematic cross-sectional view of an organic light emitting display apparatus, according to an embodiment of the present invention.

FIG. 1 is a schematic cross-sectional view of an organic light emitting display apparatus 100, according to an embodiment of the present invention.

Referring to FIG. 1, the organic light emitting display apparatus 100 includes a substrate 101, an inorganic planarization pattern portion 130, a first electrode 151, a second electrode 152, and an intermediate layer 153.

In more detail, the substrate 101 may be formed of a transparent glass material having $SiO_2$ as a main component. The substrate 101 is not necessarily limited thereto and may be formed of a transparent plastic material. In this regard, the plastic material used for forming the substrate 101 may be an insulating organic material selected from the group consisting of polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose triacetate (TAC), and cellulose acetate propionate (CAP).

A buffer layer 105 is formed on the substrate 101. The buffer layer 105 provides the upper portion of the substrate 101 with a planar surface, and prevents (or blocks) moisture and impurities from permeating into the substrate 101.

The inorganic planarization pattern portion 130 is formed on the buffer 105. The inorganic planarization pattern portion 130 includes an inorganic substance and has a set or predetermined pattern, thereby making the first electrode 151 planar. To this end, the inorganic planarization pattern portion 130 includes a planar upper surface. That is, a region of the first electrode 151 that contacts the intermediate layer 153 becomes planar so that a region in which a visible light is realized is also planar. This will now be described in more detail.

An organic layer 140 is further disposed between the inorganic planarization pattern portion 130 and the first electrode 151. The thickness of the organic layer 140 may be reduced or minimized. Such reduction or minimization of thickness enables a region of the organic layer 140 corresponding to the inorganic planarization pattern portion 130 to have the same planar surface as the inorganic planarization pattern portion 130. The thickness of the organic layer 140 may be smaller than that of the inorganic planarization pattern portion 130. The organic layer 140 may be formed using various suitable organic substances. The contact between the organic layer 140 and the first electrode 151 is better than between an inorganic substance of the inorganic planarization pattern portion 130 and the first electrode 151, and thus the first electrode 151 is efficiently formed to be planar.

The first electrode 151 is formed on the organic layer 140. The first electrode 151 is formed to have a region corresponding to the inorganic planarization pattern portion 130. The first electrode 151 may be formed of ITO, IZO, ZnO, or $In_2O_3$ so as to transmit a light generated in the intermediate layer 153. The first electrode 151 may be in the shape of a thin film including a metal, such as Ag, Mg. Al, Pt, Pd, Au, Ni, Nd, Ir, and Cr.

A pixel definition layer 145 is formed on the first electrode 151. The pixel definition layer 145 includes a variety of insulation materials and has an opening portion 145a through which a set or predetermined region of the first electrode 151 is exposed. In this regard, the opening portion 145a is formed to correspond to the inorganic planarization pattern portion 130. That is, the inorganic planarization pattern portion 130 may have the same size as or greater size than the opening portion 145a. The intermediate layer 153 is formed on the upper portion of the first electrode 151 exposed through the opening portion 145a. The second electrode 152 is formed on the intermediate layer 153.

The intermediate layer 153 includes an organic emission layer. When a voltage is applied to the first electrode 151 and the second electrode 152, visible light is emitted from the organic emission layer of the intermediate layer 153.

The second electrode 152 is formed to cover all pixels. The second electrode 152 may be formed of a variety of conductive materials and may include Li, Ca, LiF/Ca, LiF/Al, Al, Mg, ITO, IZO, ZnO, or $In_2O_3$.

A sealing member may be disposed on the second electrode 152. The sealing member is formed to protect the intermediate layer 153 and the other layers from external moisture and/or oxygen and is formed of a transparent material. To this end, the sealing member may include glass, plastic, or a plurality of stacked layers including organic and/or inorganic materials.

The organic light emitting display apparatus 100 of the present embodiment includes the inorganic planarization pattern portion 130. The inorganic planarization pattern portion 130 is formed to correspond to the opening portion 145a so that a region of the first electrode 151 corresponding to the opening portion 145a has a planar surface. As a result, a part where the first electrode 151 and the intermediate layer 153 join each other becomes easily planar so that the visible light generated in the intermediate layer 153 is uniformly realized.

In particular, since the organic light emitting display apparatus 100 of the present embodiment includes the inorganic planarization pattern portion 130 that includes an inorganic substance, although a high temperature subsequent process is performed after the inorganic planarization pattern portion 130 is formed, impurities are not caused by outgassing. Further, loosening of a surface caused by the outgassing does not occur in the inorganic planarization pattern portion 130. Thus, the organic light emitting display apparatus 100 having a reduction in the occurrence of a defect and the improved image quality is easily embodied.

The organic layer 140 is disposed between the inorganic planarization pattern portion 130 and the first electrode 151 so that the first electrode 151 is not loosened and is easily formed on the organic layer 140.

Figure 2:
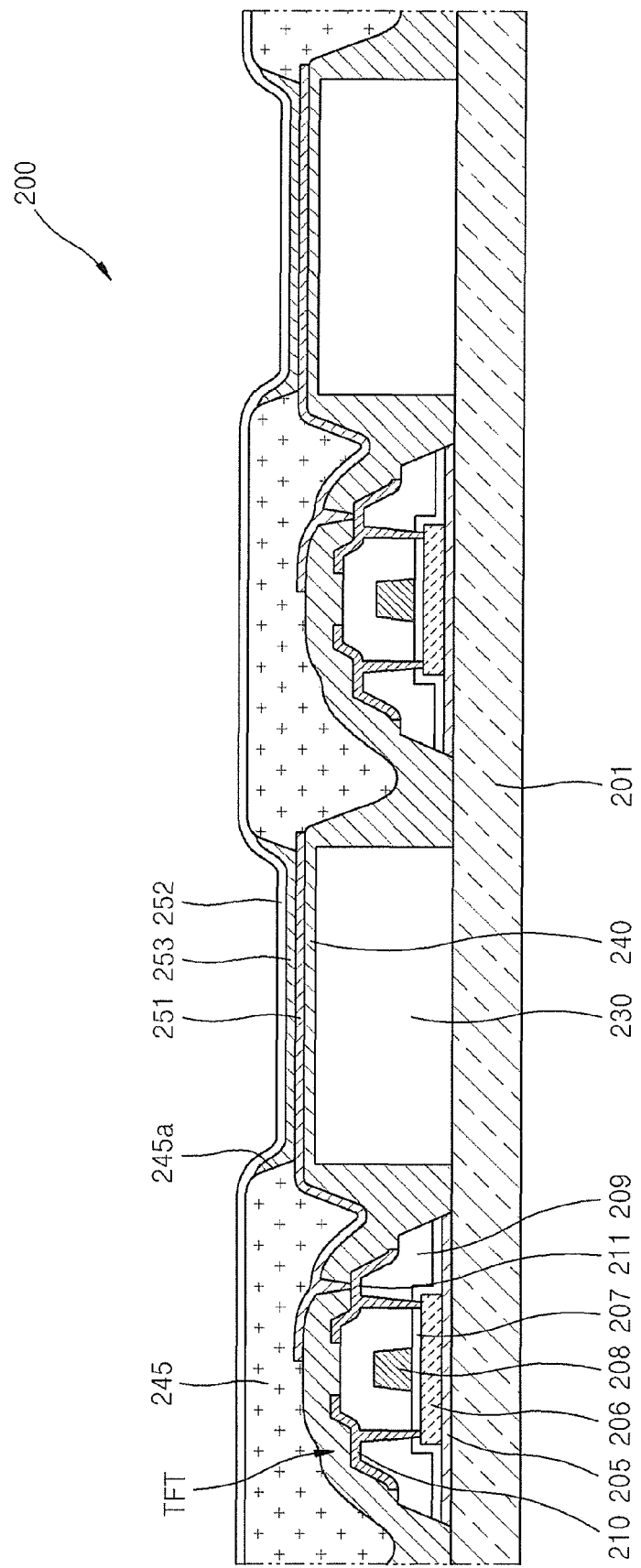
FIG. 2 is a schematic cross-sectional view of an organic light emitting display apparatus, according to another embodiment of the present invention.

FIG. 2 is a schematic cross-sectional view of an organic light emitting display apparatus 200, according to another embodiment of the present invention. For the purpose of convenience, the differences between the present embodiment and the previous embodiment will be described.

Referring to FIG. 2, the organic light emitting display apparatus 200 includes a substrate 201, an inorganic planarization pattern portion 230, a thin film transistor (TFT), a passivation layer 240, a first electrode 251, an intermediate layer 253, and the second electrode 252. The TFT includes an active layer 206, a gate insulation layer 207, a gate electrode 208, a source electrode 210, and a drain electrode 211.

In more detail, a buffer layer 205 is formed on the substrate 201. The active layer 206 having a set or predetermined pattern is formed on the buffer layer 205. The active layer 206 may be formed as an inorganic semiconductor or an organic semiconductor, such as amorphous silicone or poly silicon, and includes a source region, a drain region, and a channel region. The gate insulation layer 207 is formed on the upper portion of the active layer 206. The gate electrode 208 is formed in a set or predetermined region of the upper portion of the gate insulation layer 207. The gate electrode 208 is connected to a gate line that applies a TFT on/off signal. The gate electrode 208 may be formed of a metal or a metal alloy, such as Au, Ag, Cu, Ni, Pt, Pd, Al, Mo, or an Al:Nd alloy, an Mo:W alloy, etc. but the present invention is not limited thereto.

An interlayer insulation layer 209 is formed on the upper portion of the gate electrode 208 through which the source region and the drain region of the active layer 206 are exposed. The source electrode 210 and the drain electrode 211 are formed to contact the exposed source region and drain region of the active layer 206, respectively.

Further, the inorganic planarization pattern portion 230 is formed around the TFT on the substrate 201. The inorganic planarization pattern portion 230 includes an inorganic substance and has a set or predetermined pattern so that the first electrode 251 is formed to be planar. To this end, the inorganic planarization pattern portion 230 includes a planar upper surface. That is, a region of the first electrode 251 contacting the intermediate layer 253 is formed to be planar so that a region in which a visible light is realized becomes planar.

The passivation layer 240 is formed to cover the TFT. In this regard, one end of the passivation layer 240 extends to be formed on the upper portion of the inorganic planarization pattern portion 230. That is, one end of the passivation layer 240 extends so as to be disposed between the inorganic planarization pattern portion 230 and the first electrode 251. The passivation layer 240 includes an organic substance and is formed in the shape of a thin film. That is, the thickness of the passivation layer 240 is smaller than that of the inorganic planarization pattern portion 230.

The first electrode 251 is formed on the passivation layer 240. The passivation layer 240 is formed to expose the drain electrode 211. The first electrode 251 is connected to the exposed drain electrode 211. Further, the first electrode 251 is formed to have a region corresponding to the inorganic planarization pattern portion 230.

A pixel definition layer 245 is formed on the first electrode 251. The pixel definition layer 245 includes a variety of insulation materials and has an opening portion 245a through which a predetermined region of the first electrode 251 is exposed. In this regard, the opening portion 245a is formed to correspond to the inorganic planarization pattern portion 230. The intermediate layer 253 is formed on the upper portion of the first electrode 251 exposed through the opening portion 245a. The second electrode 252 is formed on the intermediate layer 253.

The intermediate layer 253 includes an organic emission layer. The second electrode 252 is formed to cover all pixels.

A sealing member may be disposed on the second electrode 252. The sealing member is formed to protect the intermediate layer 253 and the other layers from external moisture or oxygen and is formed of a transparent material. To this end, the sealing member may include glass, plastic, or a plurality of stacked layers including organic and/or inorganic materials.

The organic light emitting display apparatus 200 of the present embodiment includes the inorganic planarization pattern portion 230. The inorganic planarization pattern portion 230 is formed to correspond to the opening portion 245a so that the first electrode 251 has a planar surface in a region of inorganic planarization pattern portion 230 corresponding to the opening portion 245a. As a result, a part where the first electrode 251 and the intermediate layer 253 join each other becomes easily planar so that the visible light generated in the intermediate layer 253 is uniformly realized.

In particular, since the organic light emitting display apparatus 200 of the present embodiment includes the inorganic planarization pattern portion 230 that includes an inorganic substance, although a high temperature subsequent process is performed after the inorganic planarization pattern portion 230 is formed, impurities are not caused by outgassing. Further, loosening of a surface caused by the outgassing does not occur in the inorganic planarization pattern portion 230. Thus, the organic light emitting display apparatus 200 having a reduction in the occurrence of a defect and the improved image quality is easily embodied.

In addition to the inorganic planarization pattern portion 230, the organic light emitting display apparatus 200 includes the passivation layer 240 including an organic substance to cover and easily protect the TFT. In particular, the passivation layer 240 is disposed between the first electrode 251 and the inorganic planarization pattern portion 230 so that the first electrode 251 is not loosened on the passivation layer 240 and is easily formed.

In view of the forgoing, the organic light emitting display apparatus of embodiments of the present invention can easily improve the characteristics of image quality.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display apparatus comprising:
    a substrate;
    a first electrode on the substrate;
    a pixel definition layer on the first electrode and having an opening portion through which a region of the first electrode is exposed;
    an intermediate layer connected to the first electrode through the opening portion and comprising an organic emission layer;
    a second electrode electrically connected to the intermediate layer; and
    an inorganic planarization pattern portion between the substrate and the first electrode, the inorganic planarization pattern portion being formed to at least correspond to the opening portion and having a planar face,
    wherein the pixel definition layer extends past a planar surface of the inorganic planarization pattern portion along a direction normal to the substrate.

2. The organic light emitting display apparatus of claim 1, further comprising: an organic layer between the inorganic planarization pattern portion and the first electrode and contacting the first electrode.

3. The organic light emitting display apparatus of claim 2, wherein a region of the organic layer corresponding to the inorganic planarization pattern portion is planar.

4. The organic light emitting display apparatus of claim 2, wherein the thickness of the organic layer is smaller than that of the inorganic planarization pattern portion.

5. The organic light emitting display apparatus of claim 2, wherein the organic layer is formed to cover the inorganic planarization pattern portion.

6. The organic light emitting display apparatus of claim 1, further comprising: a thin film transistor (TFT) electrically connected to the first electrode.

7. The organic light emitting display apparatus of claim 6, wherein a passivation layer is on the TFT,
    wherein the TFT extends to be disposed between the inorganic planarization pattern portion and the first electrode.

8. The organic light emitting display apparatus of claim 7, wherein the passivation layer comprises an organic substance.

9. The organic light emitting display apparatus of claim 7, wherein the thickness of the passivation layer is smaller than that of the inorganic planarization pattern portion.

10. The organic light emitting display apparatus of claim 7, wherein the passivation layer is formed to cover the inorganic planarization pattern portion.

11. An organic light emitting display apparatus comprising:
    a substrate;
    a first electrode on the substrate;
    a pixel definition layer on the first electrode and having an opening portion through which a region of the first electrode is exposed;
    an intermediate layer connected to the first electrode through the opening portion and comprising an organic emission layer;
    a second electrode electrically connected to the intermediate layer;
    an inorganic planarization pattern portion between the substrate and the first electrode, formed to at least correspond to the opening portion and have a planar face; and
    an organic layer between the inorganic planarization pattern portion and the first electrode, at both sides of the inorganic planarization pattern portion along a direction parallel to the substrate, and contacting the first electrode.

12. An organic light emitting display apparatus comprising:
    a substrate;
    a first electrode on the substrate;
    a thin film transistor (TFT) electrically connected to the first electrode;
    a pixel definition layer on the first electrode and having an opening portion through which a region of the first electrode is exposed;

an intermediate layer connected to the first electrode through the opening portion and comprising an organic emission layer;
a second electrode electrically connected to the intermediate layer; and
an inorganic planarization pattern portion between the substrate and the first electrode,
the inorganic planarization pattern portion being formed to at least correspond to the opening portion, having a planar face,
wherein the pixel definition layer extends past a planar surface of the inorganic planarization pattern portion along a direction normal to the substrate, and
wherein a bottom end of the TFT is on the same plane as a bottom end of the inorganic planarization portion and between portions of the inorganic planarization pattern portion.

* * * * *